(12) United States Patent
Hodono

(10) Patent No.: US 8,135,248 B2
(45) Date of Patent: Mar. 13, 2012

(54) OPTO-ELECTRIC HYBRID BOARD AND MANUFACTURING METHOD THEREOF

(75) Inventor: Masayuki Hodono, Ibaraki (JP)

(73) Assignee: Nitto Denko Corporation, Ibaraki-shi, Osaka (JP)

( * ) Notice: Subject to any disclaimer, the term of this patent is extended or adjusted under 35 U.S.C. 154(b) by 326 days.

(21) Appl. No.: 12/622,894

(22) Filed: Nov. 20, 2009

(65) Prior Publication Data

US 2010/0129036 A1 May 27, 2010

Related U.S. Application Data

(60) Provisional application No. 61/120,628, filed on Dec. 8, 2008.

(30) Foreign Application Priority Data

Nov. 26, 2008 (JP) ................................ 2008-301378

(51) Int. Cl.
| | |
|---|---|
| *G02B 6/00* | (2006.01) |
| *G02B 6/36* | (2006.01) |
| *G02B 6/12* | (2006.01) |
| *G02F 1/035* | (2006.01) |
| *G02F 1/295* | (2006.01) |
| *B32B 37/12* | (2006.01) |
| *G03F 7/20* | (2006.01) |
| *H05K 3/30* | (2006.01) |

(52) U.S. Cl. ............................ 385/14; 385/88; 430/319
(58) Field of Classification Search .................. 385/2, 8, 385/14, 15, 16, 88–90, 122, 123, 129, 147; 430/319; 156/292; 29/829, 832
See application file for complete search history.

(56) References Cited

U.S. PATENT DOCUMENTS

| | | | | |
|---|---|---|---|---|
| 6,095,697 | A * | 8/2000 | Lehman et al. | ................... 385/88 |
| 6,185,648 | B1 * | 2/2001 | Munoz-Bustamante et al. | ............................... 710/306 |
| 6,785,447 | B2 * | 8/2004 | Yoshimura et al. | .............. 385/42 |
| 6,987,906 | B2 * | 1/2006 | Nakama et al. | ................... 385/31 |
| 7,167,608 | B2 * | 1/2007 | Ogawa | ............................ 385/14 |

(Continued)

FOREIGN PATENT DOCUMENTS

JP 2004-302345 A 10/2004

(Continued)

OTHER PUBLICATIONS

Japanese Office Action dated Feb. 22, 2011, issued in corresponding Japanese Patent Application No. 2008-301378.

(Continued)

*Primary Examiner* — Akm Ullah
(74) *Attorney, Agent, or Firm* — Westerman, Hattori, Daniels & Adrian, LLP

(57) ABSTRACT

An opto-electric hybrid board which includes an optical waveguide portion 2, an electric circuit board 1, and optical elements mounted on this electric circuit board 1. In the optical waveguide portion 2, a linear core 22 for an optical path and protruding alignment marks 24 for positioning of the optical elements and each having a surface formed with a recessed portion 24a for identification are formed on a surface of a translucent under cladding layer 21. The above-mentioned core 22 is covered with an over cladding layer 23. The above-mentioned alignment marks 24 are covered with a translucent resin film 25 so that the recessed portion 24a of each of the above-mentioned alignment marks 24 is formed as a hollow portion A filled with air.

3 Claims, 7 Drawing Sheets

U.S. PATENT DOCUMENTS

| | | |
|---|---|---|
| 7,529,439 B2 | 5/2009 | Kim et al. |
| 7,539,384 B2 | 5/2009 | Fujii et al. |
| 2005/0089264 A1* | 4/2005 | Johnson et al. ............... 385/15 |
| 2009/0208167 A1* | 8/2009 | Hodono ........................ 385/14 |
| 2009/0269704 A1* | 10/2009 | Hodono ....................... 430/319 |
| 2011/0235964 A1* | 9/2011 | Masuda et al. ............... 385/14 |

FOREIGN PATENT DOCUMENTS

| | | |
|---|---|---|
| JP | 2008-020722 A | 1/2008 |
| JP | 2008-046638 A | 2/2008 |
| JP | 2008-083205 A | 4/2008 |

OTHER PUBLICATIONS

Japanese Office Action dated May 17, 2011, issued in corresponding Japanese Patent Application No. 2008-301378.

Decision to Grant A Patent dated Jul. 26, 2011, issued in corresponding Japanese Patent Application No. 2008-301378.

* cited by examiner

PRIOR ART

PRIOR ART

OPTO-ELECTRIC HYBRID BOARD AND MANUFACTURING METHOD THEREOF

RELATED APPLICATIONS

This application claims the benefit of U.S. Provisional Application No. 61/120,628, filed Dec. 8, 2008, which is hereby incorporated by reference.

BACKGROUND OF THE INVENTION

1. Field of the Invention

The present invention relates to an opto-electric hybrid board including an optical waveguide portion, an electric circuit portion, and an optical element mounted on this electric circuit portion, and to a manufacturing method thereof.

2. Description of the Related Art

An opto-electric hybrid board is constructed, for example, as shown in FIG. 6, by bonding an electric circuit portion 6 and an optical waveguide portion 7 to each other with an adhesive 5, and then mounting a light-emitting element 3 and a light-receiving element 4 on the above-mentioned electric circuit portion 6. The above-mentioned optical waveguide portion 7 includes an optical waveguide 70 in which an under cladding layer 71, a core 72, and an over cladding layer 73 are disposed in the order named as seen from the above-mentioned electric circuit portion 6 side. The opposite end portions of this optical waveguide 70 are formed as inclined surfaces inclined at 45 degrees to an optical axis, and core 72 portions of the respective inclined surfaces are formed as light reflecting surfaces 72a. The above-mentioned electric circuit portion 6 is constructed by forming an electric circuit 61 on one surface of a substrate 60. Part of the electric circuit 61 serves as mounting pads 61a for mounting the light-emitting element 3 and the light-receiving element 4 described above thereon. The above-mentioned substrate 60 is formed with light-passing through holes 62 and 63 for propagation of light $L_1$ between the end portions of the core 72 and the light-emitting element 3 and light-receiving element 4. In FIG. 6, the reference character 3a designates a bump (an electrode) for the above-mentioned light-emitting element 3, and the reference character 4a designates a bump for the above-mentioned light-receiving element 4.

The propagation of the light $L_1$ in the above-mentioned opto-electric hybrid board is as follows. First, the light $L_1$ is emitted downwardly from the light-emitting element 3. The light $L_1$ passes through the under cladding layer 71 in a first end portion (a left-hand end portion as seen in FIG. 6) of the optical waveguide 70, and then enters a first end portion of the core 72. Subsequently, the light $L_1$ is reflected from the light reflecting surface 72a provided in the first end portion of the core 72, and travels through the interior of the core 72 in an axial direction. Then, the light $L_1$ travels through the interior of the core 72, and is propagated to a second end portion (a right-hand end portion as seen in FIG. 6) of the core 72. Subsequently, the light $L_1$ is reflected upwardly from the light reflecting surface 72a provided in the above-mentioned second end portion, passes through and exits from the under cladding layer 71, and is received by the light-receiving element 4. Thus, the accurate positioning of the light-emitting element 3 and the light-receiving element 4 relative to the opposite end portions of the core 72 of the optical waveguide 70 is important in achieving high light propagation efficiency.

To this end, there has been proposed a method of manufacturing an opto-electric hybrid board in which alignment marks 94 serving as a reference for the positioning of the light-emitting element 3 and the light-receiving element 4 are formed in an optical waveguide portion 9 so that the light-emitting element 3 and the light-receiving element 4 described above are positioned relative to the opposite end portions of a core 92 of an optical waveguide 90, as shown in FIG. 7 (see, for example, Japanese Patent Application Laid-Open No. 2004-302345). This manufacturing method includes: forming an under cladding layer 91 as the optical waveguide portion 9 with reference to FIG. 7; thereafter forming a photosensitive resin layer having a region in which the core 92 is to be formed and a region in which the alignment marks 94 are to be formed on a surface (the lower surface as seen in the figure) of the under cladding layer 91; and then forming the core 92 and the alignment marks 94 from the photosensitive resin layer by a photolithographic process. An example of each of the alignment marks 94 is formed in the shape of a disk having in its central position a through hole 94a having the shape of a cross as seen in plan view. The cross-shaped portion serves as an identifying mark. Then, a liquid material for the formation of an over cladding layer 93 is applied to the exposed surfaces of the under cladding layer 91, the core 92 and the alignment marks 94 described above, and is then hardened by exposure to light or the like, whereby the over cladding layer 93 is formed. At this time, the inside of each of the above-mentioned cross-shaped through holes 94a is also filled with the liquid material for the formation of the above-mentioned over cladding layer 93, and becomes part of the over cladding layer 93. In this manner, the alignment marks 94 are formed in predetermined positions relative to the opposite end portions of the core 92 together with the optical waveguide 90. On the other hand, a substrate 80 is prepared which is formed with light-passing through holes 82 and 83 and through holes 84 for the recognition of the above-mentioned alignment marks 94. Then, the above-mentioned substrate 80 is affixed to the upper surface of the under cladding layer 91 of the above-mentioned optical waveguide portion 9 with the adhesive 5, and an electric circuit 81 (including mounting pads 81a) is formed on the upper surface of the substrate 80 by a photolithographic process using the above-mentioned alignment marks 94 as a reference. Thus, an electric circuit portion 8 is produced on the above-mentioned optical waveguide portion 9, with the adhesive 5 lying therebetween. Thereafter, the light-emitting element 3 and the light-receiving element 4 are mounted on the mounting pads 81a. In this method, the above-mentioned mounting pads 81a are formed with reference to the alignment marks 94 formed in predetermined positions relative to the opposite end portions of the above-mentioned core 92. Therefore, the above-mentioned mounting pads 81a are positioned relative to the opposite end portions of the core 92.

However, there is a danger that the light-emitting element 3 and the light-receiving element 4 deviate from the above-mentioned mounting pads 81a during the mounting of the light-emitting element 3 and the light-receiving element 4 on the above-mentioned mounting pads 81a. To avoid the danger, Hodono has proposed a method of manufacturing an opto-electric hybrid board in which, during the mounting of the light-emitting element 3 and the light-receiving element 4, as shown in FIG. 8, the above-mentioned optical waveguide portion 9 and the electric circuit portion 8 bonded together are set on a stage S of a mounting machine, the above-mentioned alignment marks 94 are recognized by means of an alignment recognition device C provided in the mounting machine, and the mounting is achieved using the alignment marks 94 as a reference, and has applied for a patent (Japanese Patent Application No. 2008-114329; U.S. patent application Ser. No. 12/428,669). Thus, the positioning of the light-emitting element 3 and the light-receiving element 4 described above is accomplished more properly. In FIG. 8, the reference character $L_2$ designates light for illumination or the like reflected diffusely from the surface of the above-mentioned stage S and then passing through a portion of the over cladding layer 93 inside the through hole 94a, which will be described later.

In this manner, the above-mentioned alignment marks 94 are generally made of the material for the formation of the core 92 by the photolithographic process at the same time that the core 92 of the optical waveguide 90 is formed from the viewpoint of the positioning relative to the end portions of the core 92. The alignment marks 94 made of the material for the formation of the core 92 are embedded in the over cladding layer 93 at the surface of the under cladding layer 91, and the cross-shaped portion in the central position of each of the above-mentioned alignment marks 94 serves as part of the over cladding layer 93. As a result of the nature of the optical waveguide 90, the alignment marks 94 made of the material for the formation of the core 92 are translucent, and the under cladding layer 91 and the over cladding layer (including the cross-shaped portions) 93 are generally also translucent. Additionally, there is a difference in refractive index between the alignment marks 94 (approximately 1.588 as the refractive index of the core 92) and the under cladding layer 91 and over cladding layer 93 (having a refractive index of approximately 1.502 to 1.542), but the difference in refractive index is small (approximately 0.05 to 0.09).

For this reason, both the cross-shaped portions of the above-mentioned alignment marks 94 and their surrounding portions are recognized as being bright, and the difference in brightness therebetween is small. As a matter of fact, it is difficult to see the cross-shaped portions of the above-mentioned alignment marks 94 through the under cladding layer 91 by using a pattern matching scheme employed for the alignment recognition device C of the mounting machine (a scheme such that an image is converted into coordinates and numerals by the numerical conversion of the contrast between black and white; a gray scale pattern recognition scheme), as shown in FIG. 8. Additionally, the surface (the surface exposed to the through holes 84 for the recognition of the alignment marks 94; the upper surface as seen in the figure) of the under cladding layer 91 is uneven. Light for illumination or the like is reflected diffusely because of the unevenness, and it tends to be difficult to obtain an image having a constant contrast. For this reason, the recognition takes much time, and the mounting step requires a prolonged period of time. Also, there is apprehension that false recognition results. In this regard, there is room for improvement.

DISCLOSURE OF THE INVENTION

In view of the foregoing, it is an object of the present invention to provide an opto-electric hybrid board in which a recessed portion for identification having the shape of a cross and the like is easily recognizable by means of a recognition device and the like when the recessed portion is formed in an alignment mark, and a method of manufacturing the opto-electric hybrid board.

To accomplish the above-mentioned object, a first aspect of the present invention is intended for an opto-electric hybrid board comprising: an optical waveguide portion; an electric circuit portion; and an optical element mounted on the electric circuit portion, said optical waveguide portion including a translucent under cladding layer, a linear core for an optical path formed on a surface of the under cladding layer, a protruding alignment mark for positioning of the optical element, the alignment mark having a surface formed with a recessed portion for identification, the alignment mark being formed on the surface of the under cladding layer, and an over cladding layer for covering said core, said alignment mark being covered with a translucent resin film so that the recessed portion of said alignment mark is formed as a hollow portion filled with air.

A second aspect of the present invention is intended for a method of manufacturing an opto-electric hybrid board including an optical waveguide portion, an electric circuit portion, and an optical element mounted on the electric circuit portion, wherein the production of said optical waveguide portion comprises the steps of: forming a linear core for an optical path and a protruding alignment mark for positioning of the optical element and having a surface formed with a recessed portion for identification on a surface of a translucent under cladding layer; covering said core with an over cladding layer; and covering said alignment mark with a translucent resin film so that said recessed portion is formed as a hollow portion filled with air.

According to the present invention, the term "recessed portion" formed in the surface of the alignment mark is to be interpreted as including a recessed portion which has a bottom surface extending to the surface of the under cladding layer and which extends through the alignment mark.

The present inventor has made studies of the structure of the alignment mark so that a recessed portion for identification having the shape of a cross and the like is easily recognizable by means of a recognition device and the like when the recessed portion is formed in the alignment mark serving as a reference for the mounting position of the optical element in the manufacture of the opto-electric hybrid board. As a result, the present inventor has found that, when the above-mentioned recessed portion is formed as a hollow portion (with reference to FIG. 1A) filled with air (generally having a refractive index of 1.000), a difference in brightness between the hollow portion and its surrounding portion becomes great because of a great difference (approximately 0.5 to 0.6) in refractive index therebetween. Thus, the present inventor has attained the present invention.

Specifically, for example, when the alignment mark is seen through the under cladding layer, light passing through the inside of the resin film and reaching the hollow portion of the alignment mark is reflected from an interface between the resin film and the hollow portion (with reference to FIG. 5). This is because the refractive index (generally 1.000) of the above-mentioned hollow portion (air) is much lower than the refractive index (approximately 1.502 to 1.542 as high as that of the over cladding layer) of the resin film. For this reason, it is difficult for the above-mentioned light to pass through the hollow portion, and the hollow portion is recognized as being dark. Additionally, a difference in brightness between the hollow portion and its surrounding portion becomes great because of a great difference (approximately 0.5 to 0.6) in refractive index therebetween. Thus, if light for illumination or the like is reflected diffusely from the surface of the under cladding layer, a clear contrast is obtained, and it is easy to recognize the hollow portion.

In the opto-electric hybrid board according to the present invention, the alignment mark having the recessed portion for identification serving as a reference for the mounting position of the optical element is covered with the translucent resin film, whereby the above-mentioned recessed portion is formed as the hollow portion filled with air. For this reason, a difference in brightness between the hollow portion and its surrounding portion becomes great because of a great difference in refractive index therebetween. This makes it easy to recognize the above-mentioned hollow portion during the mounting of the optical element. As a result, the opto-electric hybrid board according to the present invention includes the optical element mounted with high accuracy to achieve improved light propagation efficiency.

Also, in the method of manufacturing the opto-electric hybrid board according to the present invention, the alignment mark having the recessed portion for identification serving as a reference for the mounting position of the optical element is covered with the translucent resin film, whereby the above-mentioned recessed portion is formed as the hollow portion filled with air. For this reason, a difference in brightness between the hollow portion and its surrounding portion becomes great because of a great difference in refractive index therebetween. This makes it easy to recognize the above-mentioned hollow portion during the mounting of the optical element. As a result, false recognition is prevented, and the recognition is achieved in a short time, which results in improved productivity.

DETAILED DESCRIPTION OF THE INVENTION

Next, an embodiment according to the present invention will now be described in detail with reference to the drawings.

Figure 1A:
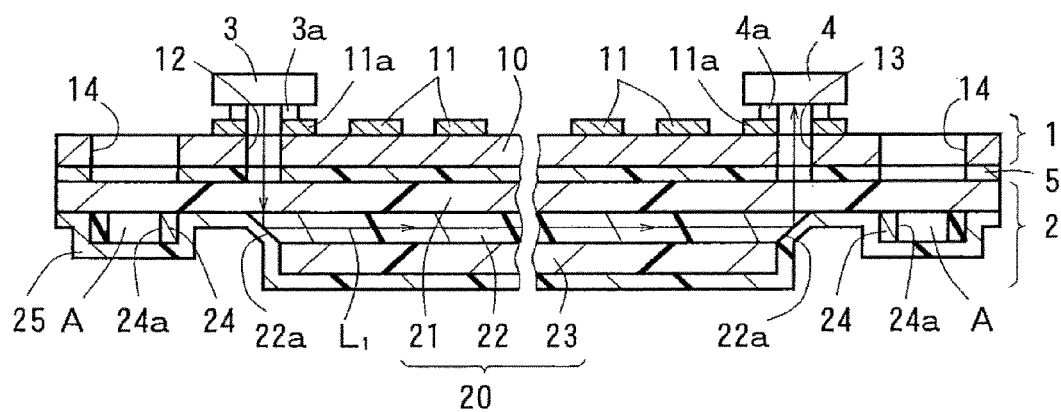
FIG. 1A is a vertical sectional view schematically showing an opto-electric hybrid board according to a embodiment of the present invention.

FIG. 1A shows an opto-electric hybrid board according to one embodiment of the present invention. This opto-electric hybrid board includes an electric circuit board (electric circuit portion) 1 having a first surface with an electric circuit 11 formed thereon, and an optical waveguide portion 2 bonded to a second surface of the electric circuit board 1 with an adhesive 5 and including an optical waveguide 20 and alignment marks 24. The opto-electric hybrid board further includes optical elements (a light-emitting element 3 and a light-receiving element 4) mounted on portions (mounting pads 11a) of the above-mentioned electric circuit 11 corresponding to end portions of the above-mentioned optical waveguide 20 by using the above-mentioned alignment marks 24 as a reference. In such an opto-electric hybrid board, each of the above-mentioned alignment marks 24 is formed with a hollow portion A, which will be described in detail later. This makes the above-mentioned hollow portion A easy to recognize during the mounting of the above-mentioned optical elements to improve mounting accuracy. This is one of the characteristics of the present invention.

Figure 1B:
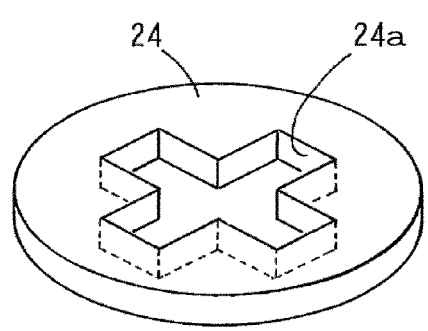
FIG. 1B is a perspective view on an enlarged scale showing an alignment mark.

Description will now be made in further detail. The above-mentioned optical waveguide portion 2 includes a translucent under cladding layer 21 formed on the above-mentioned electric circuit board 1 side. A linear core 22 for an optical path, and the alignment marks 24 made of a material for the formation of the core 22 are formed on a surface (the lower surface as seen in the figure) of the under cladding layer 21. As shown, both left-hand and right-hand end surfaces of the above-mentioned core 22 are formed as light reflecting surfaces 22a inclined at 45 degrees to the above-mentioned electric circuit board 1. An intermediate portion of the core 22 except the light reflecting surfaces 22a is covered with an over cladding layer 23. In this manner, the above-mentioned under cladding layer 21, the core 22 and the over cladding layer 23 constitute the optical waveguide 20. Also in this embodiment, as shown in FIG. 1B, each of the above-mentioned alignment marks 24 is formed in the shape of a disk (a protrusion), and includes a recessed portion 24a for identification having the shape of a cross as seen in plan view and formed in a surface (the lower surface as seen in the figure) of each alignment mark 24 so as to extend through each alignment mark 24. The above-mentioned alignment marks 24 are covered with a translucent resin film 25, as shown in FIG. 1A. Thus, the above-mentioned recessed portions 24a are formed as the hollow portions A closed by the above-mentioned resin film 25 and filled with air. Each of the alignment marks 24 having this hollow portion A is one of the characteristics of the present invention. In this embodiment, an exposed portion of the optical waveguide 20 is also covered with the above-mentioned resin film 25.

Figure 5:
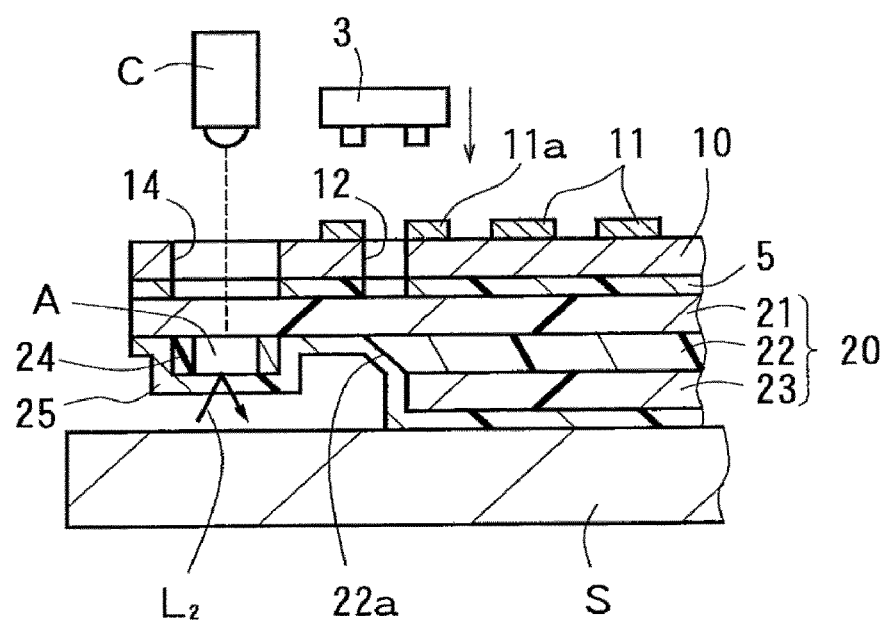
FIG. 5 is an illustration schematically showing the step of mounting an optical element in the manufacturing method of the above-mentioned opto-electric hybrid board.
Figure 6:
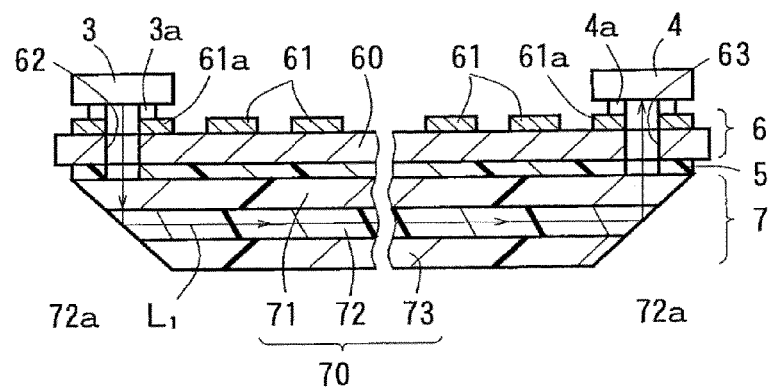
FIG. 6 is a vertical sectional view schematically showing a conventional opto-electric hybrid board.
Figure 7:
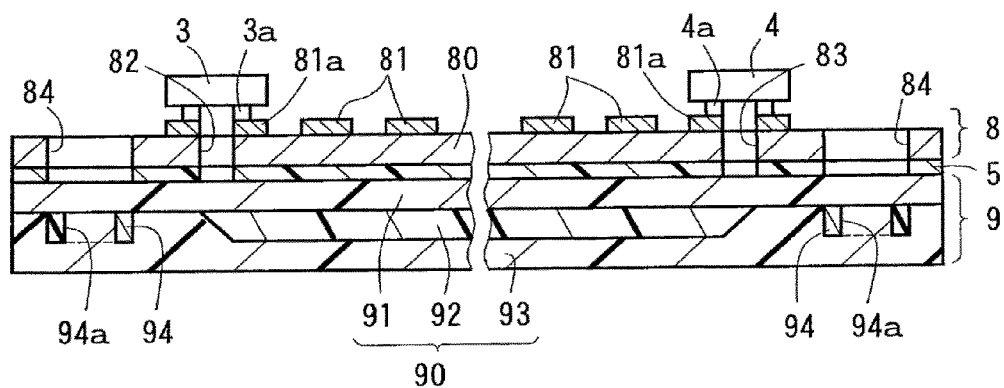
FIG. 7 is a vertical sectional view schematically showing another conventional opto-electric hybrid board.

With this arrangement according to the present invention, when, for the mounting of the optical elements, the under cladding layer 21 and the resin film 25 placed, for example, on the upper and lower sides, respectively, are set on a stage S of a mounting machine, and an alignment recognition device C provided in the mounting machine is used to see the alignment marks 24 from above through the under cladding layer 21, as shown in FIG. 5, then light $L_2$ which is light for illumination or the like reflected diffusely from the top surface of the stage S comes from the resin film 25 over the stage S to the hollow portion A of the alignment mark 24, and is reflected from an interface therebetween. This is because the refractive index (typically 1.000) of the above-mentioned hollow portion (air) A is much lower than the refractive index (approximately 1.502 to 1.542 as high as that of the over cladding layer) of the resin film 25. For this reason, it is difficult for the above-mentioned light $L_2$ to pass through the hollow portion A upwardly, and the hollow portion A is recognized as being dark by means of the above-mentioned alignment recognition device C. Additionally, a difference in brightness between the hollow portion A and its surrounding portion becomes great because of a great difference (approximately 0.5 to 0.6) in refractive index therebetween. Thus, if the light $L_2$ for illumination or the like is reflected diffusely from a surface (a surface exposed to a through hole 14 for the recognition of the alignment mark 24) of the under cladding layer 21, an image having a clear contrast is obtained, and it is easy to recognize the above-mentioned cross-shaped hollow portion A by means of the above-mentioned alignment recognition device C.

Figure 8:
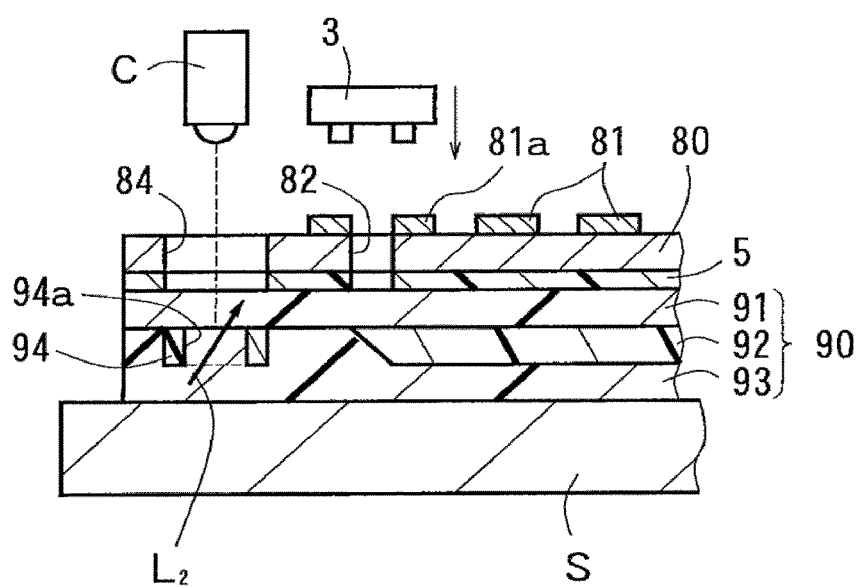
FIG. 8 is an illustration schematically showing the step of mounting an optical element in a manufacturing method of the conventional opto-electric hybrid board.

In the Hodono, on the other hand, the inside of the through hole 94a of each of the alignment marks 94 is filled with the material for the formation of the over cladding layer 93, as shown in FIG. 8. For this reason, over the stage S of the above-mentioned mounting machine, the light $L_2$ which is light for illumination or the like reflected diffusely from the surface of the stage S passes through the over cladding layer 93 portion inside the through hole 94a upwardly.

On the other hand, as shown in FIG. 1A, the above-mentioned electric circuit board 1 is constructed such that the electric circuit 11 is formed on a surface of a stainless steel substrate 10, with an insulation layer (not shown) therebetween. Part of the electric circuit 11 serves as the mounting pads 11a for mounting the light-emitting element 3 and the light-receiving element 4 described above thereon. Light-passing through holes 12 and 13 for propagation of light between the end portions of the core 22 and the light-emitting element 3 and light-receiving element 4 are formed in portions of the above-mentioned stainless steel substrate 10 corresponding to positions over the light reflecting surfaces 22a provided in the opposite end portions of the above-mentioned core 22. Additionally, through holes 14 for the recognition of the alignment marks 24 from the side where the electric circuit 11 is formed are formed in portions of the stainless steel substrate 10 corresponding to positions over the above-mentioned alignment marks 24. In FIG. 1A, the reference character 3a designates a bump (an electrode) for the above-mentioned light-emitting element 3, and the reference character 4a designates a bump for the above-mentioned light-receiving element 4.

Light propagation in the above-mentioned opto-electric hybrid board is accomplished in a manner to be described below. As shown in FIG. 1A, light $L_1$ emitted from the above-mentioned light-emitting element 3 passes through the through hole 12 for light propagation formed in the above-mentioned electric circuit board 1. Thereafter, the light $L_i$ passes through the under cladding layer 21, and then enters a first end portion of the core 22. Then, the light $L_1$ is reflected from the light reflecting surface 22a provided in the first end portion of the above-mentioned core 22, and travels through the interior of the core 22 in an axial direction. Then, the light $L_1$ is propagated to the light reflecting surface 22a provided in a second end portion of the core 22. Subsequently, the light $L_1$ is reflected upwardly from the light reflecting surface 22a provided in the above-mentioned second end portion, and passes through and exits from the under cladding layer 21. Then, the light $L_1$ passes through the light-passing through hole 13 of the above-mentioned stainless steel substrate 10, and thereafter is received by the light-receiving element 4.

Figure 2A:
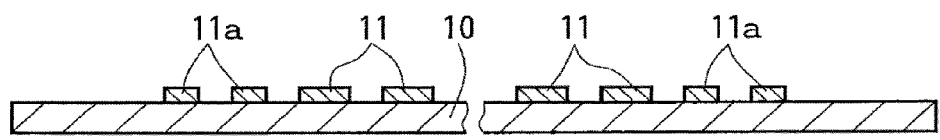
FIGS. 2A and 2B are illustrations schematically showing a process for producing an electric circuit board in a manufacturing method of the above-mentioned opto-electric hybrid board.
Figure 2B:
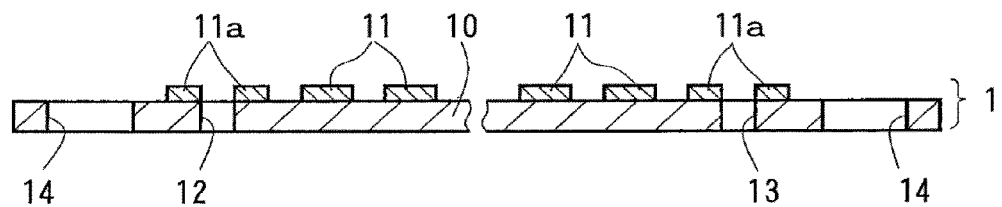

The opto-electric hybrid board according to this embodiment is manufactured by undergoing the following process steps (1) to (4):

(1) the step of forming the electric circuit 11 on the surface of the stainless steel substrate 10 to produce the electric circuit board 1 (with reference to FIGS. 2A and 2B);

(2) the step of forming the above-mentioned optical waveguide 20 and the alignment marks 24 to produce the optical waveguide portion 2 separately (with reference to FIGS. 3A to 3D);

(3) the step of bonding the above-mentioned electric circuit board 1 and the optical waveguide portion 2 to each other with the adhesive 5 (with reference to FIGS. 4A to 4C); and (4) the step of mounting the light-emitting element 3 and the light-receiving element 4 on the above-mentioned electric circuit 11 (with reference to FIG. 5).

The above-mentioned step (1) of producing the electric circuit board 1 will be described. In this embodiment, the above-mentioned stainless steel substrate 10 (with reference to FIG. 2A) is initially prepared. A stainless steel substrate having a thickness in the range of 20 to 200 μm is typically used as this stainless steel substrate 10.

Then, as shown in FIG. 2A, the insulation layer (not shown) having a predetermined pattern is formed by a photolithographic process in a predetermined position of the surface of the above-mentioned stainless steel substrate 10. This insulation layer is formed except where the light-passing through holes 12 and 13 and the through holes 14 for the recognition of the alignment marks 24 are to be formed in the stainless steel substrate 10 in a subsequent step (with reference to FIG. 2B). Specifically, for the formation of the above-mentioned insulation layer, a photosensitive resin such as a photosensitive epoxy resin and the like is first applied to the predetermined position of the single surface (the upper surface as seen in the figure) of the above-mentioned stainless steel substrate 10 to form a photosensitive resin layer. Then, through a photomask formed with an opening pattern corresponding to the pattern of the insulation layer, the above-mentioned photosensitive resin layer is exposed to irradiation light. Next, development is performed using a developing solution to dissolve away unexposed portions, thereby forming the remaining photosensitive resin layer into the pattern of the insulation layer. Thereafter, a heating treatment is performed to remove the developing solution remaining on the surface and the like of the remaining photosensitive resin layer. Thus, the above-mentioned remaining photosensitive resin layer is formed into the insulation layer. The thickness of the insulation layer is typically in the range of 5 to 15 μm.

Next, as shown in FIG. 2A, the electric circuit 11 including the mounting pads 11a is formed in a predetermined pattern on a surface of the above-mentioned insulation layer. Specifically, for the formation of the electric circuit 11, a metal layer (having a thickness on the order of 600 to 2600 Å) is initially formed on the surface of the above-mentioned insulation layer by sputtering, electroless plating or the like. This metal layer becomes a seed layer (a layer serving as a basis material for the formation of an electroplated layer) for a subsequent electroplating process. Then, a dry film resist is affixed to the opposite surfaces of a laminate comprised of the above-mentioned stainless steel substrate 10, the insulation layer, and the metal layer (seed layer). Thereafter, a pattern such that the pattern of the electric circuit 11 appears as groove portions is formed by a photolithographic process in the dry film resist on the side where the above-mentioned metal layer is formed, so that surface portions of the above-mentioned metal layer are exposed or uncovered at the bottoms of the groove portions. Next, electroplating is performed to form an electroplated layer (having a thickness on the order of 5 to 20 μm) in a stacked manner on the surface portions of the above-mentioned metal layer exposed or uncovered at the bottoms of the above-mentioned groove portions. Then, the above-mentioned dry film resist is stripped away using an aqueous sodium hydroxide solution and the like. Thereafter, a metal layer portion on which the above-mentioned electroplated layer is not formed is removed by soft etching, so that a laminate portion comprised of the remaining electroplated layer and the underlying metal layer is formed into the electric circuit 11.

Then, as shown in FIG. 2B, the light-passing through holes 12 and 13 and the through holes 14 for the recognition of the alignment marks 24 (with reference to FIG. 1A) are formed in predetermined positions of the stainless steel substrate 10 by etching or the like. The light-passing through holes 12 and 13 are formed in positions corresponding to the light reflecting surfaces 22a provided in the opposite end portions of the core (with reference to FIG. 1A) to be formed in a later step of producing the optical waveguide portion 2, and the through holes 14 for the recognition of the above-mentioned alignment marks 24 are formed in positions corresponding to the alignment marks 24. Specifically, for the formation of these through holes 12, 13 and 14, a dry film resist is initially affixed to the opposite surfaces of a laminate comprised of the above-mentioned stainless steel substrate 10, the insulation layer, and the electric circuit 11. Thereafter, hole portions having the pattern of the above-mentioned through holes 12, 13 and 14 are formed by a photolithographic process in the dry film resist on the side where the above-mentioned insulation layer is not formed, so that surface (the lower surface as seen in the figure) portions of the above-mentioned stainless steel substrate 10 are exposed or uncovered at the bottoms of the hole portions. Next, etching or the like using an aqueous ferric chloride solution is performed to bore holes in the portions of the above-mentioned stainless steel substrate 10 exposed or uncovered at the bottoms of the above-mentioned hole portions, thereby forming the above-mentioned light-passing through holes 12 and 13 and the through holes 14 for the recognition of the alignment marks 24. The diameter of the above-mentioned light-passing through holes 12 and 13 is set as appropriate depending on the design of the optical elements and the like, and is typically in the range of 0.05 to 0.2 mm. The diameter of the through holes 14 for the recognition of the above-mentioned alignment marks 24 is set as appropriate depending on the size of the alignment marks 24, and is typically in the range of 0.1 to 3.0 mm. In this manner, the step (1) of producing the above-mentioned electric circuit board 1 is completed.

Next, the above-mentioned step (2) of producing the optical waveguide portion 2 will be described. First, a base 26 of a flat shape (with reference to FIG. 3A) for use in the production of the optical waveguide portion 2 is prepared. Examples of a material for the formation of the base 26 include glass, quartz, silicon, resins, metals and the like. The thickness of the base 26 is, for example, in the range of 20 μm to 5 mm.

Figure 3A:
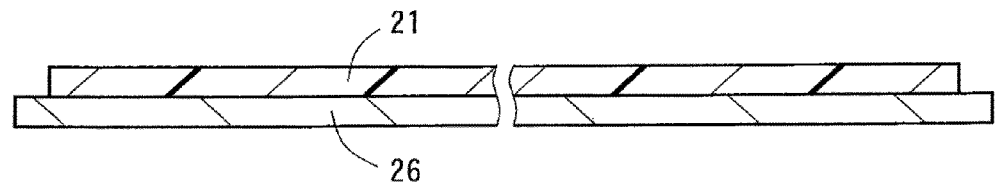
FIGS. 3A to 3D are illustrations schematically showing a process for producing an optical waveguide portion in the manufacturing method of the above-mentioned opto-electric hybrid board.

Then, as shown in FIG. 3A, the under cladding layer 21 is formed on a predetermined region of a surface of the above-mentioned base 26. The formation of this under cladding layer 21 is accomplished, for example, in a manner to be described below. Specifically, a varnish prepared by dissolving a photosensitive resin for the formation of the under cladding layer 21 such as a photosensitive epoxy resin and the like in a solvent is initially applied to the predetermined region of the surface of the above-mentioned base 26. Thereafter, a heating treatment (at 50 to 120° C. for approximately 10 to 30 minutes) is performed, as required, to dry the varnish, thereby forming a photosensitive resin layer for the formation of the under cladding layer 21. Then, the photosensitive resin layer is exposed to irradiation light such as ultraviolet light and the like. This causes the photosensitive resin layer to be formed into the under cladding layer 21. The thickness of the under cladding layer 21 is typically in the range of 1 to 50 μm.

Figure 3B:
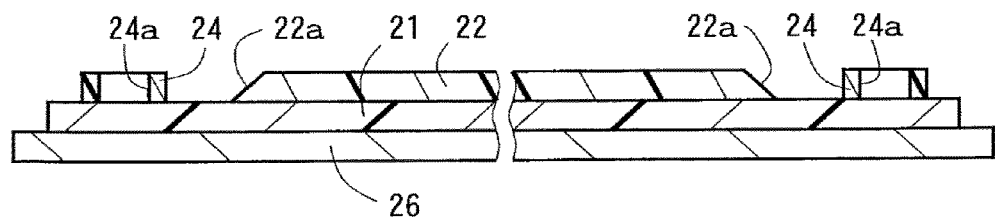

Next, as shown in FIG. 3B, the core 22 having a predetermined pattern and the disk-shaped alignment marks 24 each including in its central position the recessed portion 24a having the shape of a cross as seen in plan view are formed at the same time in predetermined positions of the surface of the above-mentioned under cladding layer 21. The formation of this core 22 and the alignment marks 24 is accomplished, for example, by a photolithographic process. Specifically, a photosensitive resin layer having a region in which the core 22 is to be formed and a region in which the alignment marks 24 are to be formed is initially formed in a predetermined position of the surface of the above-mentioned under cladding layer 21 in a manner similar to the process for forming the photosensitive resin layer for the formation of the above-mentioned under cladding layer 21. Then, the above-mentioned photosensitive resin layer is exposed to irradiation light through a photomask formed with an opening pattern corresponding to the pattern of the core 22 and the alignment marks 24 (including the pattern of the cross-shaped recessed portions 24a). Next, a heating treatment is performed. Thereafter, development is performed using a developing solution to dissolve away unexposed portions of the above-mentioned photosensitive resin layer, thereby forming the remaining photosensitive resin layer into the pattern of the core 22 and the alignment marks 24. This causes surface portions of the above-mentioned under cladding layer 21 to be exposed or uncovered at the bottoms of the above-mentioned cross-shaped recessed portions 24a of the respective alignment marks 24. Also, the above-mentioned exposure causes the core 22 to be formed in a linear shape, and causes the opposite end surfaces of the core 22 to be formed as the inclined surfaces inclined at 45 degrees. Thereafter, a heating treatment is performed to remove the developing solution remaining on the surface and the like of the remaining photosensitive resin layer. Thus, the photosensitive resin layer is formed into the core 22 and the alignment marks 24 having the predetermined pattern. In this manner, the single photolithographic process is performed to form the core 22 and the alignment marks 24 having the predetermined pattern at the same time, thereby forming the alignment marks 24 in the predetermined positions relative to the end portions of the core 22.

For the formation of the above-mentioned core 22 and the alignment marks 24 according to this embodiment, the opposite end portions of the core 22 are formed so as to be positioned under the above-mentioned light-passing through holes 12 and 13, and the alignment marks 24 are formed so as to be positioned under the through holes 14 for the recognition of the above-mentioned alignment marks 24. The thickness of the core 22 is typically in the range of 5 to 60 μm, and the width thereof is typically in the range of 5 to 60 μm. The diameter of the above-mentioned disk-shaped alignment marks 24 is typically in the range of 100 to 1000 μm, and the thickness thereof is typically in the range of 5 to 60 μm. The groove width of the cross shape of the recessed portions 24a formed in the alignment marks 24 is typically in the range of 5 to 100 μm, and the vertical and horizontal dimensions of the cross shape are typically in the range of 5 to 900 μm. The material for the formation of the above-mentioned core 22 and the alignment marks 24 includes, for example, a photosensitive resin similar to that of the above-mentioned under cladding layer 21, and the material used herein has a refractive index greater than that of the material for the formation of the above-mentioned under cladding layer 21 and the over cladding layer 23 to be described below. The adjustment of this refractive index may be made, for example, by adjusting the selection of the types of the materials for the formation of the above-mentioned under cladding layer 21, the core 22 (including the alignment marks 24) and the over cladding layer 23, and the composition ratio thereof.

Figure 3C:
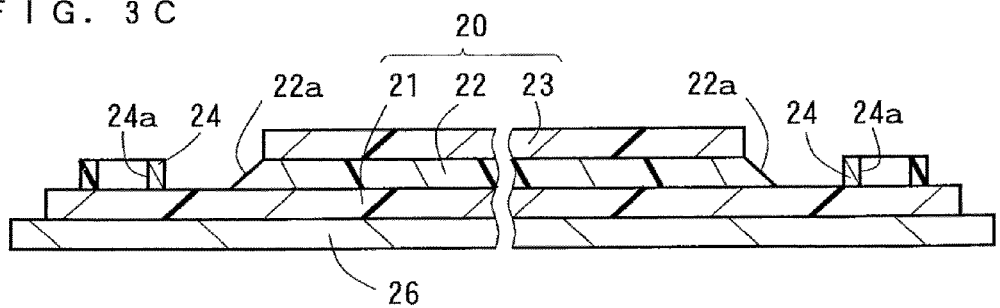

Next, as shown in FIG. 3C, the over cladding layer 23 having a predetermined pattern is formed on the surface of the above-mentioned under cladding layer 21 so as to cover the above-mentioned core 22. The formation of this over cladding layer 23 is accomplished, for example, by a photolithographic process. Specifically, a photosensitive resin layer for the formation of the over cladding layer 23 is initially formed on the surface of the above-mentioned under cladding layer 21 in a manner similar to the process for forming the photosensitive resin layer for the formation of the above-mentioned under cladding layer 21 so as to cover the above-mentioned core 22 and the alignment marks 24. Then, the over cladding layer 23 having the predetermined pattern is formed by a photolithographic process using a photomask formed with an opening pattern corresponding to the pattern of the over cladding layer 23. At this time, portions of the photosensitive resin layer which cover the alignment marks 24 are adapted not to be exposed to irradiation light by the design of the above-mentioned photomask. The unexposed portions are removed by development, and the alignment marks 24 are exposed or uncovered. The light reflecting surfaces 22a provided in the opposite end portions of the core 22 are not covered with the over cladding layer 23 but are exposed or uncovered. The thickness of this over cladding layer 23 is typically in the range of 10 to 2000 μm. An example of the material for the formation of the above-mentioned over cladding layer 23 used herein includes a photosensitive resin similar to that of the above-mentioned under cladding layer 21.

Figure 3D:
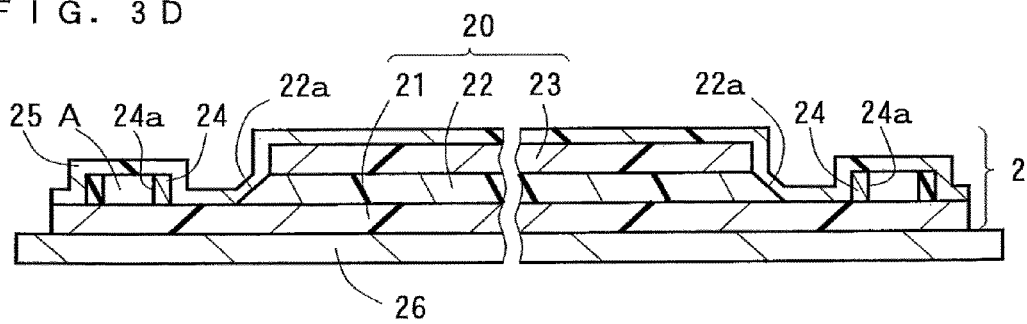

Then, as shown in FIG. 3D, exposed or uncovered portions of the above-mentioned under cladding layer 21, the opposite end surfaces (the light reflecting surfaces 22a) of the core 22, the over cladding layer 23 and the surfaces of the alignment marks 24 are covered with a translucent resin film by a laminating process and the like. At this time, the resin film does not enter the inside of the cross-shaped recessed portions 24a of the alignment marks 24. This causes the cross-shaped recessed portions 24a to be formed into the cross-shaped hollow portions A filled with air. The above-mentioned resin film 25 used herein has a refractive index approximately equal to that of the above-mentioned over cladding layer 23. Examples of a material for the formation of the resin film 25 used herein include epoxy resins, acrylic resins, and the like. In particular, the resin film 25 in a semi-cured condition having flexibility and tackiness is preferably used. The thickness of the above-mentioned resin film 25 is typically in the range of 15 to 20 μm. In this manner, the step of producing the optical waveguide portion 2 with the optical waveguide 20 and the alignment marks 24 formed on the surface of the above-mentioned base 26 is completed.

The formation of the hollow portion A in each of the alignment marks 24 in the step of producing the above-mentioned optical waveguide portion 2 is one of the characteristics of the present invention. This provides a large difference in refractive index between the above-mentioned cross-shaped hollow portions A and their surrounding portions, which will be described later. Thus, during the mounting of the light-emitting element 3 and the light-receiving element 4 by means of a mounting machine, the above-mentioned cross-shaped hollow portions A are recognized as being darker than their surrounding portions and are easy to recognize when the above-mentioned alignment marks 24 are seen by means of the alignment recognition device C provided in the mounting machine.

Figure 4A:
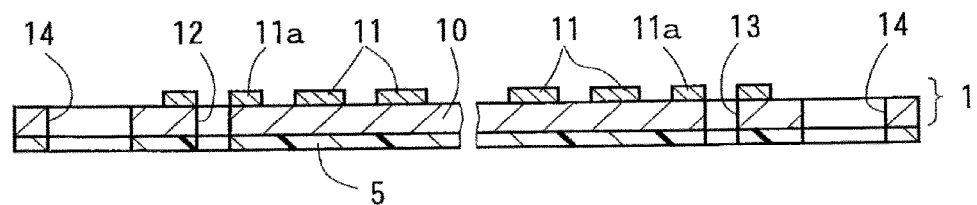
FIGS. 4A to 4C are illustrations schematically showing the step of bonding the electric circuit board and the optical waveguide portion to each other in the manufacturing method of the above-mentioned opto-electric hybrid board.
Figure 4B:
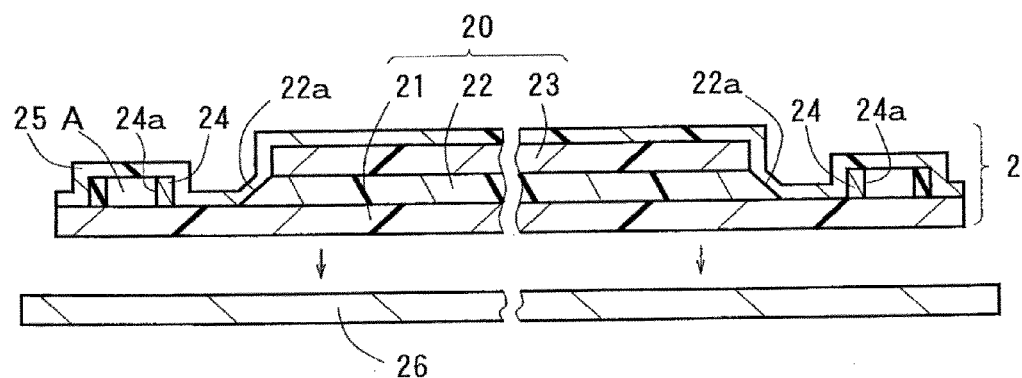
Figure 4C:
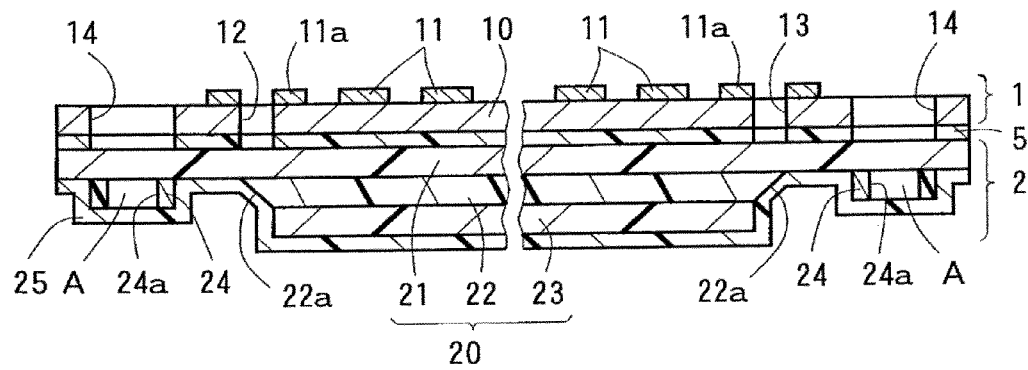

Next, the above-mentioned step (3) of bonding the above-mentioned electric circuit board 1 and the optical waveguide portion 2 to each other will be described. Specifically, as shown in FIG. 4A, the adhesive 5 is initially applied to an opposite surface of the above-mentioned electric circuit board 1 from the surface on which the electric circuit 11 is formed. Then, as shown in FIG. 4B, the base 26 affixed to the above-mentioned optical waveguide portion 2 is detached from the under cladding layer 21. Then, as shown in FIG. 4C, the surface (from which the base 26 is removed) of the under cladding layer 21 of the above-mentioned optical waveguide portion 2 is bonded to the above-mentioned electric circuit board 1 with the above-mentioned adhesive 5. At this time, the end portions of the core 22 are positioned under the light-passing through holes 12 and 13 formed in the electric circuit board 1, and the alignment marks 24 are positioned under the through holes 14 for the recognition of the alignment marks 24 which are formed in the electric circuit board 1. In this manner, the above-mentioned step (3) of bonding the above-mentioned electric circuit board 1 and the optical waveguide portion 2 to each other is completed.

Next, the above-mentioned step (4) of mounting the light-emitting element 3 and the light-receiving element 4 will be described. Specifically, the above-mentioned electric circuit board 1 and the optical waveguide portion 2 bonded together are set on the stage S of the mounting machine, with the surface on which the electric circuit 11 is formed facing upward, as shown in FIG. 5. Then, using the alignment recognition device C provided in the mounting machine, the cross-shaped hollow portion A of one (for example, a left-hand one as seen in FIG. 1A) of the alignment marks 24 is seen from above through the under cladding layer 21 and through a corresponding one of the through holes 14 for the recognition of the alignment marks 24. At this time, light (light for illumination or the like) from above is reflected diffusely from the surface of the stage S of the above-mentioned mounting machine. This diffusely reflected light $L_2$ travels upwardly in the over cladding layer 23. Part of the light $L_2$ which reaches the cross-shaped hollow portion A of the alignment mark 24 is reflected downwardly from the interface between the over cladding layer 23 and the cross-shaped hollow portion A. This is because the refractive index of the cross-shaped hollow portion (air) A is much lower than that of the over cladding layer 23. Additionally, a difference in brightness between the cross-shaped hollow portion A and its surrounding portion becomes great because of a great difference (approximately 0.5 to 0.6) in refractive index therebetween. Thus, it is easy to recognize the above-mentioned cross-shaped hollow portion A by means of the above-mentioned alignment recognition device C, and the recognition is achieved in a short time. The above-mentioned mounting machine positions one of the optical elements (for example, the light-emitting element 3) in a set position (over one of the light reflecting surfaces 22a) defined using the cross-shaped hollow portion A of the above-mentioned alignment mark 24 as a reference to mount the optical element on the mounting pads 11a. The cross-shaped hollow portion A of the other (for example, a right-hand one as seen in FIG. 1A) of the alignment marks 24 is similarly recognized, and used as a reference for positioning during the mounting of the other optical element (for example, the light-receiving element 4). Examples of the above-mentioned light-emitting element 3 include a VCSEL (Vertical Cavity Surface Emitting Laser) and the like. Examples of the above-mentioned light-receiving element 4 include a PD (Photo Diode) and the like.

Examples of a method of mounting the above-mentioned light-emitting element 3 and light-receiving element 4 include a flip-chip method, a solder reflow method, a C4 bonding method using screen printing of solder bumps and solder paste, and the like. Of these method, the flip-chip method using ultrasonic waves and heating is preferable from the viewpoint of reducing misregistration during the mounting, and the flip-chip method using ultrasonic waves is more preferable from the viewpoint of preventing heat damages to the above-mentioned stainless steel substrate 10. In this manner, the above-mentioned step (4) of mounting the light-emitting element 3 and the light-receiving element 4 is completed, and the intended opto-electric hybrid board (with reference to FIG. 1A) is obtained.

In the above-mentioned embodiment, the electric circuit board 1 and the optical waveguide portion 2 are produced separately, and are bonded to each other with the adhesive 5. However, the optical waveguide portion 2 may be formed directly on the electric circuit board 1.

Also, the formation of the core 22 and the alignment marks 24 is accomplished by a photolithographic process in the above-mentioned embodiment, but may be are accomplished by press molding using a molding die. In this case, the molding die used herein is made of a material (for example, quartz) permeable to irradiation light such as ultraviolet light and the like, and is formed with a die surface (recessed portions) complementary in shape to the pattern of the above-mentioned core 22 and the alignment marks 24. Then, the molding die is pressed against the photosensitive resin layer having the region in which the core 22 is to be formed and the region in which the alignment marks 24 are to be formed. In that state, exposure to irradiation light such as ultraviolet light and the like is performed through the above-mentioned molding die. Then, a heating treatment is performed. Thereafter, the molding die is removed. In this manner, the press molding may be performed.

The recessed portions 24a for identification formed in the alignment marks 24 are formed so as to extend through the alignment marks 24 in the above-mentioned embodiment, but may be configured so as not to extend through the alignment marks 24. The method therefor is achieved, for example, by adjusting the height of a die surface portion for the molding of the above-mentioned recessed portions 24a during the press molding using the above-mentioned molding die. Further, the shape of the recessed portions 24a of the alignment marks 24 is the shape of a cross as seen in plan view in the above-mentioned embodiment, but may be other shapes.

In the above-mentioned embodiment, the stainless steel substrate 10 is used for the production of the electric circuit board 1. However, a plate material made of other metal materials, resin materials or the like may be used. When the plate material has insulating properties, the electric circuit 11 may be formed directly on the above-mentioned substrate without the formation of the insulation layer. The above-mentioned insulation layer is provided to prevent a short circuit from occurring between the plate material having electrical conductivity such as the above-mentioned metal plate material and the electric circuit 11.

Further, the light-emitting element 3 and light-receiving element 4 and the optical waveguide 20 are disposed on the opposite surfaces with respect to the electric circuit board 1 in the above-mentioned embodiment, but may be disposed on the same surface. In this case, the end surface provided in the second end portion of the core 22 is not formed as the light reflecting surface 22a (the inclined surface) but is formed as a light-receiving and light-emitting end surface (a surface orthogonal to the electric circuit board 1).

Also, in the above-mentioned embodiment, the optical waveguide 20 and the alignment marks 24 are formed on the surface of the base 26, and thereafter the above-mentioned base 26 is detached. However, if the above-mentioned base 26 is translucent, the base 26 may be bonded to the electric circuit board 1 without being detached.

Next, an inventive example of the present invention will be described in conjunction with a comparative example. It should be noted that the present invention is not limited to the inventive example.

INVENTIVE EXAMPLE

Electric Circuit Board

An electric circuit board was produced in which an insulation layer (having a thickness of 10 µm) made of a photo-sensitive polyimide resin was formed on one surface of a stainless steel plate material (SUS 304 foil having a thickness of 25 µm) and in which an electric circuit including mounting pads was formed on a surface of the insulation layer. Through holes for light propagation and through holes for recognition of alignment marks were formed in this electric circuit board.

Material for Formation of Under Cladding Layer and Over Cladding Layer

A material for formation of an under cladding layer and an over cladding layer was prepared by mixing 35 parts by weight of bisphenoxyethanol fluorene glycidyl ether (component A), 40 parts by weight of 3',4'-epoxycyclohexyl methyl-3,4-epoxycyclohexane carboxylate which is an alicyclic epoxy resin (CELLOXIDE 2021P manufactured by Daicel Chemical Industries, Ltd.) (component B), 25 parts by weight of (3'4'-epoxycyclohexane)methyl-3',4'-epoxycyclohexyl-carboxylate (CELLOXIDE 2081 manufactured by Daicel Chemical Industries, Ltd.) (component C), and 2 parts by weight of a 50% propione carbonate solution of 4,4'-bis [di(β-hydroxyethoxy)phenylsulfinio]phenyl-sulfide-bis-hexafluoroantimonate (component D).

Material for Formation of Core and Alignment Marks

A material for formation of a core and the alignment marks was prepared by dissolving 70 parts by weight of the aforementioned component A, 30 parts by weight of 1,3,3-tris{4-[2-(3-oxetanyl)]butoxyphenyl}butane and one part by weight of the aforementioned component D in ethyl lactate.

Production of Optical Waveguide Portion

The material for the formation of the above-mentioned under cladding layer was applied to a surface of a polyethylene terephthalate (PET) film [160 mm×160 mm×188 µm (thick)] with an applicator. Thereafter, exposure by the use of irradiation with ultraviolet light at 2000 mJ/cm² was performed. Next, a heating treatment was performed at 100° C. for 15 minutes to form the under cladding layer (having a thickness of 20 µm).

Then, the material for the formation of the above-mentioned core and the alignment marks was applied to a surface of the above-mentioned under cladding layer with an applicator. Thereafter, a drying process was performed at 100° C. for 15 minutes to form a photosensitive resin layer having a region in which the core was to be formed and a region in which the alignment marks were to be formed. Next, a synthetic quartz chrome mask (photomask) formed with an opening pattern identical in shape with the pattern of the core and the alignment marks was placed over the photosensitive resin layer. Then, exposure by the use of irradiation with ultraviolet light at 4000 mJ/cm² was performed by a proximity exposure method from over the mask. Thereafter, a heating treatment was performed at 80° C. for 15 minutes. Next, development was carried out using an aqueous solution of γ-butyrolactone to dissolve away unexposed portions. Thereafter, a heating treatment was performed at 120° C. for 30 minutes to form the core (having a thickness of 50 µm and a width of 50 µm) and the alignment marks (having a thickness of 50 µm). The core was formed in a linear shape, and opposite end surfaces of the core were formed as inclined surfaces inclined at 45 degrees. Each of the alignment marks was formed in the shape of a disk having a diameter of 1000 µm, and a recessed portion having the shape of a cross as seen in plan view was formed in the central position of each of the alignment marks. The groove width of the cross shape was 50 µm, and the vertical and horizontal dimensions of the groove were 700 µm.

Next, the material for the formation of the over cladding layer was applied to the surface of the above-mentioned under cladding layer with an applicator so as to cover the core and the alignment marks. Then, exposure by the use of irradiation with ultraviolet light at 2000 mJ/cm² was performed through a photomask designed so that portions of the photosensitive resin layer which covered the alignment marks were not exposed to light. Thereafter, a heating treatment was performed at 120° C. for 15 minutes. Next, development was carried out using an aqueous solution of γ-butyrolactone to dissolve away unexposed portions. Thereafter, a heating treatment was performed at 120° C. for 30 minutes. Thus, the over cladding layer (having a thickness of 50 μm from the surface of the core) which covered a core portion except the opposite end surfaces (the inclined surfaces) was formed, and the alignment marks were exposed or uncovered.

Then, exposed or uncovered portions of the above-mentioned under cladding layer, the opposite end surfaces (the light reflecting surfaces) of the core, the over cladding layer and the surfaces of the alignment marks were laminated with a semi-cured resin (cladding) film made of a photosensitive epoxy resin. This caused the cross-shaped recessed portions of the alignment marks to be formed into cross-shaped hollow portions filled with air. Then, the above-mentioned semi-cured resin film was hardened by irradiation with ultraviolet light. In this manner, an optical waveguide portion in which an optical waveguide and the alignment marks were formed on the surface of the above-mentioned PET film was produced.

Bonding of Electric Circuit Board and Optical Waveguide Portion

An epoxy resin based adhesive film (NA590 manufactured by Nitto Denko Corporation) was affixed to an opposite surface of the above-mentioned electric circuit board from a surface on which the electric circuit was formed. Then, the PET film affixed to the above-mentioned optical waveguide portion was detached from the under cladding layer, and the surface (from which the PET film was detached) of the under cladding layer was bonded to the above-mentioned electric circuit board with the above-mentioned epoxy resin based adhesive film. At this time, the end portions of the core under the light-passing through holes formed in the electric circuit board were made visible through the light-passing through holes. Also, the alignment marks under the through holes for the recognition of the alignment marks which were formed in the electric circuit board were made visible through the through holes for the recognition of the alignment marks.

COMPARATIVE EXAMPLE

The exposure of the photosensitive resin layer to light was performed without using the photomask during the formation of the over cladding layer in Inventive Example described above. This caused the alignment marks to be embedded in the over cladding layer, and caused the inside of the cross-shaped recessed portions to be filled with the material for the formation of the over cladding layer. The subsequent process of laminating with the resin film was not performed. Except for the above, Comparative Example was similar to Inventive Example. Thus, the electrical circuit board and the optical waveguide portion were bonded to each other.

Recognition Degree Test for Alignment Marks

The electric circuit board and the optical waveguide portion bonded together were set on a stage of a mounting machine (Flip Chip Bonder TFC-3200 manufactured by Shibaura Mechatronics Corporation), with the surface on which the electric circuit was formed facing upward, in Inventive Example and Comparative Example described above. Then, the alignment marks in Inventive Example and the alignment marks in Comparative Example were recognized by means of an alignment recognition device (of a pattern matching type) provided in the mounting machine. As a result, the degree of recognition (a pattern matching score) was 95% in Inventive Example. On the other hand, the degree of recognition was 70% in Comparative Example.

This result shows that the alignment marks in Inventive Example is easy to recognize, as compared with the alignment marks in Comparative Example.

Although a specific form of embodiment of the instant invention has been described above and illustrated in the accompanying drawings in order to be more clearly understood, the above description is made by way of example and not as a limitation to the scope of the instant invention. It is contemplated that various modifications apparent to one of ordinary skill in the art could be made without departing from the scope of the invention which is to be determined by the following claims.

What is claimed is:

1. An opto-electric hybrid board comprising:
   an optical waveguide portion;
   an electric circuit portion; and
   an optical element mounted on the electric circuit portion,
   said optical waveguide portion including
   a translucent under cladding layer,
   a linear core for an optical path formed on a surface of the under cladding layer,
   a protruding alignment mark for positioning of the optical element, the alignment mark having a surface formed with a recessed portion for identification, the alignment mark being formed on the surface of the under cladding layer, and
   an over cladding layer for covering said core,
   said alignment mark being covered with a translucent resin film so that the recessed portion of said alignment mark is formed as a hollow portion filled with air.

2. A method of manufacturing an opto-electric hybrid board, comprising the steps of:
   (a) producing an electric circuit portion;
   (b) producing an optical waveguide portion;
   (c) mounting an optical element on said electric circuit portion,
   said step (b) including the steps of:
   forming a translucent under cladding layer;
   forming on a surface of the under cladding layer a linear core for an optical path, and a protruding alignment mark for positioning of said optical element and having a surface formed with a recessed portion for identification;
   covering said core with an over cladding layer; and
   covering said alignment mark with a translucent resin film so that said recessed portion of said alignment mark is formed as a hollow portion filled with air.

3. The method of manufacturing the opto-electric hybrid board according to claim 2, wherein the covering with said resin film is laminating with a semi-cured resin film.

* * * * *